US009626467B2

United States Patent
Bu et al.

(10) Patent No.: US 9,626,467 B2
(45) Date of Patent: Apr. 18, 2017

(54) SOI MOS DEVICE MODELING METHOD

(71) Applicant: Institute of Microelectronics, Chinese Academy of Sciences, Beijing (CN)

(72) Inventors: Jianhui Bu, Beijing (CN); Jinshun Bi, Beijing (CN); Jiajun Luo, Beijing (CN); Zhengsheng Han, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/415,275

(22) PCT Filed: Sep. 21, 2012

(86) PCT No.: PCT/CN2012/081781
§ 371 (c)(1),
(2) Date: Jan. 16, 2015

(87) PCT Pub. No.: WO2014/012300
PCT Pub. Date: Jan. 23, 2014

(65) Prior Publication Data
US 2015/0178429 A1 Jun. 25, 2015

(30) Foreign Application Priority Data

Jul. 17, 2012 (CN) .......................... 2012 1 0248270

(51) Int. Cl.
*G06F 17/50* (2006.01)
*H01L 29/417* (2006.01)
*H01L 29/78* (2006.01)

(52) U.S. Cl.
CPC .... *G06F 17/5036* (2013.01); *H01L 29/41758* (2013.01); *H01L 29/78* (2013.01)

(58) Field of Classification Search
CPC ...................................................... G06F 17/50
(Continued)

(56) References Cited

U.S. PATENT DOCUMENTS

| 8,539,408 B1* | 9/2013 | Cheng ................. G06F 17/5036 716/110 |
| 2002/0066933 A1 | 6/2002 | Tsu-Jae |
| 2013/0117002 A1* | 5/2013 | Goo ..................... G06F 17/5036 703/13 |

FOREIGN PATENT DOCUMENTS

| CN | 101458722 A | 6/2009 |
| CN | 101976283 A | 2/2011 |

(Continued)

OTHER PUBLICATIONS

International Search Report issued in PCT/CN2012/081781 mailed on Mar. 28, 2013 (4 pages).

(Continued)

*Primary Examiner* — Thuan Do
(74) *Attorney, Agent, or Firm* — Osha Liang LLP

(57) ABSTRACT

The present invention provides a SOI MOS device modeling method. The SOI MOS device is one having a source-drain injection not reaching the bottom. The method comprises: a) establishing an overall model comprising a primary MOS device model simulating an SOI MOS device having the source-drain injection reaching the bottom, a source body PN junction bottom capacitance model simulating a source body PN junction bottom capacitance, and a drain body PN junction bottom capacitance model simulating a drain body PN junction bottom capacitance; and b) extracting parameters respectively for the primary MOS device model, the source body PN junction bottom capacitance model, and the drain body PN junction bottom capacitance model in the overall model. In the prior art, the source body junction bottom capacitance and the drain body junction bottom capacitance in the SOI MOS device having a source-drain injection not reaching the bottom affect the performances of the device. The modeling method of the present invention takes the effect into consideration, improves model preci- (Continued)

sion, and can be effectively used for the simulation design of a device.

2 Claims, 2 Drawing Sheets

(58) Field of Classification Search
USPC .......................................................... 716/110
See application file for complete search history.

(56) References Cited

FOREIGN PATENT DOCUMENTS

| | | |
|---|---|---|
| CN | 102081686 A | 6/2011 |
| CN | 102142057 A | 8/2011 |
| CN | 102214252 A | 10/2011 |

OTHER PUBLICATIONS

Written Opinion of the International Searching Authority issued in PCT/CN2012/081781 mailed on Mar. 28, 2013 (3 pages).
Chinese Office Action for corresponding Chinese Application No. 201210248270.5 issued on Jun. 26, 2014 (4 pages).
Chinese Office Action for corresponding Chinese Application No. 201210248270.5 issued on Mar. 14, 2014 (6 pages).
Guo, C.; "MOS Device Model Parameter Extraction"; China (PRC) Master Thesis Database, Mar. 14, 2014, pp. 4-28 (27 pages).

\* cited by examiner

SOI MOS DEVICE MODELING METHOD

CROSS REFERENCE TO RELATED APPLICATIONS

This application is a national stage application, filed under U.S.C. §371, of PCT Application No. PCT/CN2012/081781, filed on Sep. 21, 2012, entitled "SOI MOS DEVICE MODELING METHOD", which claimed priority to Chinese Patent Application No. 201210248270.5, filed on 17 Jul. 2012, all of which are hereby incorporated by reference in their entirety.

FIELD OF THE INVENTION

The present invention relates to the device parameters extraction and modeling field, particularly, to a method for modeling SOI MOS devices having source-drain injection not reaching the bottom.

BACKGROUND OF THE INVENTION

Along with development and increasingly wide application of integrated circuit technology, the design of integrate circuits has to take into account requirements for high reliability, excellent performance and low costs. There is a growing demand for functions and precision in respect of IC CAD software statistical variation tolerance analysis, optimized design, yield rate, cost analysis and prediction of reliability. However, in IC CAD software, device model of MOSFET is a critical link that links IC design and IC product function and performance. As sizes of integrated devices become smaller and smaller, the integration scale becomes increasingly large, and processing of integrated circuits becomes more and more complicated, all of these require greater precision for device models. Today, how to provide a MOSFET model with precision has without doubt become a problem for IC CAD designers to solve urgently; it is also an important and hot research topic across the world. Currently, the mainstream MOSFET device modeling in the industry is BSIM modeling, while correspondingly SOI MOSFET device modeling is BSIMSOI modeling.

The devices corresponding to BSIMSOI is devices having source-drain injection reaching the bottom. However, in the practice of circuit designing, MOSFET usually makes use of device structures having source-drain injection not reaching the bottom in order to facilitate the implementing of body leads along the direction of channel length. This would increase the source body junction bottom capacitance and the drain body junction bottom capacitance, but the traditional BSIM SOI modeling is incapable of accommodating effects of this.

SUMMARY OF THE INVENTION

In respect of the issue that the prior modeling is incapable of accommodating the effects on device performance arising from a source body junction bottom capacitance and a drain body junction bottom capacitance in the case of having source-drain injection not reaching the bottom, the present invention aims to provide an SOI MOS modeling method having source-drain injection not reaching the bottom; the method comprises:

a) establishing an overall model comprising a primary MOS device model simulating an SOI MOS device having the source-drain injection reaching the bottom, a source body PN junction bottom capacitance model simulating a source PN junction bottom capacitance model simulating a source body PN junction bottom capacitance, and a drain body PN junction bottom capacitance model simulating a drain body PN junction bottom capacitance; and b) extracting parameters respectively for the primary MOS device model, the source body PN junction bottom capacitance model, and the drain body PN junction bottom capacitance model in the overall model.

The modeling method of the present invention takes the effects into consideration, improves model precision, and can be effectively used for the simulation design of a device.

DETAILED DESCRIPTION OF THE INVENTION

Figure 1:
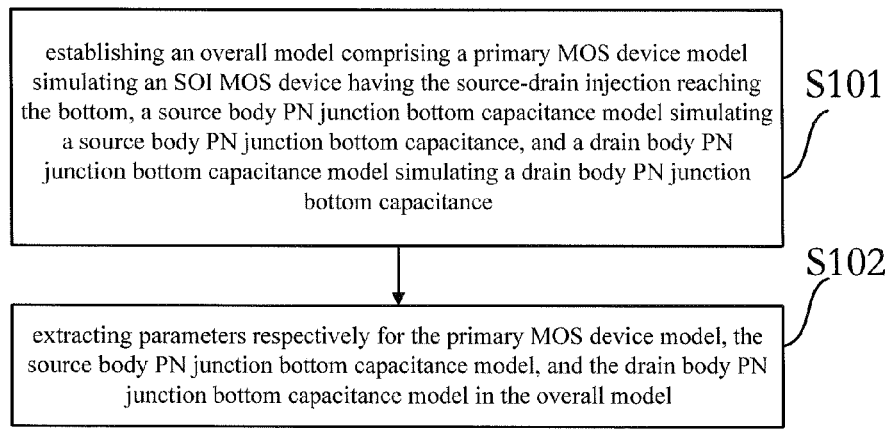
FIG. 1 illustrates a flowchart according to a method of modeling a SOI MOS device having source-drain injection not reaching the bottom.

Objectives, technical solutions and advantages of the present invention are made more evident and easily understood according to perusal of the following detailed description of exemplary embodiment(s) in conjunction with accompanying drawings.

Embodiments of the present invention are described at length below, wherein examples of the embodiments are illustrated in the drawings, in which same or similar reference signs throughout denote same or similar elements or elements have same or similar functions. It should be appreciated that embodiments described below in conjunction with the drawings are illustrative, and are provided for explaining the prevent invention only, thus shall not be interpreted as a limit to the present invention.

Various embodiments or examples are provided here below to implement different structures of the present invention. To simplify the disclosure of the present invention, descriptions of components and arrangements of specific examples are given below. Of course, they are only illustrative and not limiting the present invention. Moreover, in the present invention, reference numbers and/or letters may be repeated in different examples. Such repetition is for purposes of simplicity and clarity, yet does not denote any relationship between respective embodiments and/or arrangements under discussion.

Figure 2:
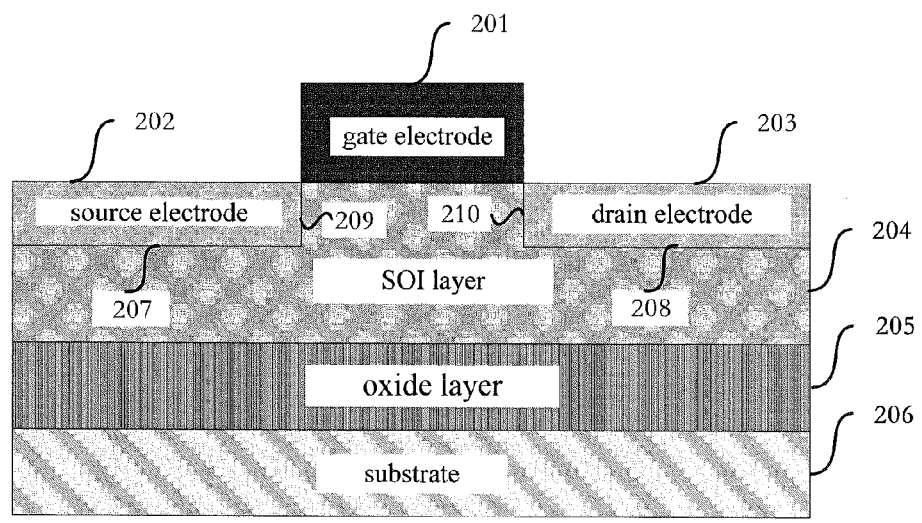
FIG. 2 illustrates a cross-sectional diagram of an exemplary SOI MOS device having source-drain injection not reaching the bottom.
Figure 3:
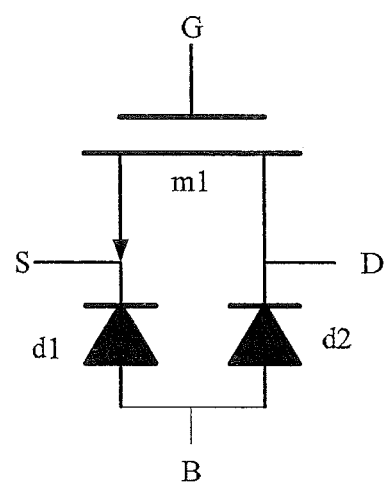
FIG. 3 illustrates a general circuit diagram of an overall model of an SOI MOS device having source-drain injection not reaching the bottom.

The present invention is to be explained in conjunction with FIG. 1 to FIG. 3.

FIG. 1 illustrates a flowchart according to a method of modeling an SOI MOS device having source-drain injection not reaching the bottom.

At step S101, an overall model comprising a primary MOS device model simulating an SOI MOS device having the source-drain injection reaching the bottom, a source body PN junction bottom capacitance model simulating a source body PN junction bottom capacitance, and a drain body PN junction bottom capacitance model simulating a drain body PN junction bottom capacitance is established;

An SOI MOS device having source-drain injection not reaching the bottom, which the present invention intends to deal with, is to be explained with reference to FIG. 2.

FIG. 2 illustrates a cross-sectional diagram of an exemplary SOI MOS device having source-drain injection not reaching the bottom. An SOI MOS device is usually formed in an SOI substrate, which generally comprises an SOI layer 204, a burial oxide layer 205 and a bulk silicon substrate 206. An SOI device generally comprises a gate 201, a source 202 and a drain 203. As shown, because the source-drain does not reach the bottom, thus part of the SOI layer below the source-drain regions would still be in the original doping type, which therefore forms a source body PN junction bottom capacitance 207 and a drain body PN junction bottom capacitance 208.

These two PN junctions bottom capacitances have not been taken into account in the current BSIMSOI modeling, which nonetheless merely considers the source body PN junction side capacitance 209 and the drain body PN junction side capacitance 210.

As such, the embodiment of the present invention exemplifies simulation of an SOI MOS device having source-drain injection not reaching the bottom by establishing an overall model (sub-circuit model) comprising a primary MOS device model (i.e. BSIMSOI model) simulating an SOI MOS device having the source-drain injection reaching the bottom, a source body PN junction bottom capacitance model simulating a source body PN junction bottom capacitance, and a drain body PN junction bottom capacitance model simulating a drain body PN junction bottom capacitance.

For example, a sub-circuit model (i.e. the overall model, wherein the circuit layout is generally as shown by FIG. 3) may be defined by using the following SPICE mode: wherein m1, d1 and de refer to device names. nmos, pwell refer to device model names.

.subckt nch d g s b iw=3.5u il=0.35u as='iw*8e-7' ps='iw+1.6e-6' ad='iw*8e-7' pd='iw+1.6e-6' dtemp=0 count=1 (defining connecting node and parameters of a sub-circuit nch)

m1 d g s e b nmos w=iw l=il as=as ps=ps ad=ad pd=pd dtemp=dtemp m=count (defining MOS device m1 using BSIMSOI model)

v1 e GND! 0v d1 b s pwell area=as pj=ps dtemp=dtemp (defining the source body PN junction d1 that simulates the source body PN junction bottom capacitance)

d2 b d pwell area=ad pj=pd dtemp=dtemp (defining the drain body PN junction d2 that simulates drain body PN junction bottom capacitance).

As the BSIMSOI model comprises a source body PN junction side capacitance and a drain body PN junction side capacitance, thus it is necessary to set PN junction side capacitances in diodes d1 and d2 as zero. For example, this may be done by setting up the unit length side junction capacitance parameter cjsw in d1 and d2 as zero. Alternatively, another sub-circuit model (i.e. the overall model) may be defined by using the following SPICE code:

```
.subckt nch d g s b iw=3.5u il=0.35u as='iw*8e-7' ps='iw+1.6e-6'
ad='iw*8e-7' pd='iw+1.6e-6' dtemp=0 count=1
m1 d g s e b nmos w=iw l=il as=as ps=ps ad=ad pd=pd
dtemp=dtemp m=count
v1 e GND! 0v
d1 b s pwell area=as pj=0, dtemp=dtemp
d2 b d pwell area=ad pj=0 dtemp=dtemp
```

In this model, the PN junction perimeter pj is set as 0, while it does not matter whether the parameter cjsw is set as 0 or not. Accordingly, this avoids repeatedly defining PN junction side capacitance in the primary MOS device m1, the source body PN junction d1 and the drain body PN junction d2.

At step S102, parameters respectively for the primary MOS device model, the source body PN junction bottom capacitance model, and the drain body PN junction bottom capacitance model in the overall model are extracted.

This process may be implemented by using commercial software such as Agilent Model Builder Programmer (MBP). With respect to a specific SOI technology having source-drain injection not reaching the bottom, parameters from the primary MOS device model NMOS and the PN junction bottom capacitance model pwell are extracted respectively. Accordingly, the SOI MOS devices having source-drain injections not reaching bottom can be accurately modeled.

The modeling method is verified using ring oscillator. Take Chinese Academy of Sciences Institute of Microelectronics 0.35 um SOI technology as an example. The test cycle 101 level ring oscillator is 12 ns. The simulating result of using the standard method (i.e. merely using BSIMSOI modeling) is 9.5 ns, while the simulating result of using the model (having PN junction but not comprising side junction) constructed in the embodiments of the present invention is 12 ns. It may be noted that there is better agreement between the model constructed according to the embodiments of the present invention and the test results.

The above embodiment is a preferred embodiment of the present invention, but the modes for implementing the present invention are not limited by the above embodiment. It should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

What is claimed is:

1. A method for modeling and simulating a SOI (silicon-on-insulator) MOS (metal-oxide semiconductor) device using a BSIMSOI (Berkeley Short-Channel IGFET Model Silicon on Insulator) model, wherein the SOI MOS device is a SOI MOS device having source-drain injection not reaching a bottom, and the method comprises:

establishing an overall model comprising a primary MOS device model simulating a SOI MOS device having the source-drain injection reaching the bottom, a source body PN junction bottom capacitance model simulating a source body PN junction bottom capacitance, and a drain body PN junction bottom capacitance model simulating a drain body PN junction bottom capacitance; and extracting parameters respectively for the primary MOS device model, the source body PN junction bottom capacitance model, and the drain body PN junction bottom capacitance model in the overall model, wherein the source body PN junction bottom capacitance model and the drain body PN junction bottom capacitance model are PN junction capacitance models in SPICE (Simulation Program with Integrated Circuit Emphasis), wherein a side junction capacitance is set as zero, and wherein the side junction capacitance is set as zero by setting at least one of a PN junction perimeter capacitance and a PN junction unit perimeter capacitance as zero.

2. The method according to claim 1, wherein the side junction capacitance of the source body PN junction bottom capacitance model and the side junction capacitance of the drain body PN junction bottom capacitance model are set as zero by setting a unit length side junction capacitance of the source body PN junction bottom capacitance model and a unit length side junction capacitance of the drain body PN junction bottom capacitance model as zero.

* * * * *